(12) United States Patent
Brun

(10) Patent No.: US 8,860,200 B2
(45) Date of Patent: Oct. 14, 2014

(54) STACKED ELECTRONIC DEVICE AND METHOD OF MAKING SUCH AN ELECTRONIC DEVICE

(75) Inventor: Jean Brun, Champagnier (FR)

(73) Assignee: Commissariat a l'Energie Atomique et aux Energies Alternatives (FR)

( * ) Notice: Subject to any disclaimer, the term of this patent is extended or adjusted under 35 U.S.C. 154(b) by 665 days.

(21) Appl. No.: 12/737,060

(22) PCT Filed: Jun. 2, 2009

(86) PCT No.: PCT/EP2009/056757
§ 371 (c)(1),
(2), (4) Date: Dec. 2, 2010

(87) PCT Pub. No.: WO2009/147148
PCT Pub. Date: Dec. 10, 2009

(65) Prior Publication Data
US 2011/0114377 A1 May 19, 2011

(30) Foreign Application Priority Data
Jun. 3, 2008 (FR) ..................................... 08 53662

(51) Int. Cl.
*H01L 23/02* (2006.01)
*H01L 21/00* (2006.01)
(52) U.S. Cl.
USPC ............ 257/686; 257/777; 438/109; 438/107
(58) Field of Classification Search
USPC .......... 257/686, 777, 784, 778; 438/107, 108, 438/109, 110
See application file for complete search history.

(56) References Cited

U.S. PATENT DOCUMENTS

| | | | |
|---|---|---|---|
| 5,104,820 A | 4/1992 | Go et al. | |
| 5,311,401 A | 5/1994 | Gates, Jr. et al. | |
| 2001/0008794 A1 | 7/2001 | Akagawa | |
| 2002/0180041 A1 | 12/2002 | Sahara et al. | |
| 2004/0106335 A1 | 6/2004 | Nemoto et al. | |
| 2004/0178495 A1 | 9/2004 | Yean et al. | |
| 2004/0251530 A1* | 12/2004 | Yamaji | 257/686 |
| 2005/0009329 A1 | 1/2005 | Tanida et al. | |
| 2006/0237833 A1 | 10/2006 | Klein et al. | |
| 2008/0009098 A1 | 1/2008 | Lee et al. | |

(Continued)

FOREIGN PATENT DOCUMENTS

| | | |
|---|---|---|
| DE | 103 48 620 | 6/2005 |
| EP | 1 154 474 | 11/2001 |
| EP | 1 670 057 | 6/2006 |

(Continued)

*Primary Examiner* — Sheila V Clark
(74) *Attorney, Agent, or Firm* — Baker & Hostetler LLP

(57) ABSTRACT

This invention relates to a stacked electronic device composed of stacked electronic components (120, 130) distributed on one or several added-on levels (N2, N3) each added on the preceding level starting from a base level (N1) possibly containing at least one electronic component (110). At least one electrolytic connection pad of a first type (10.1) on an add-on level (N2) directly connects a conducting element (c1) placed on one face of an electronic component (120) on an add-on level (N2) to a conducting element (z1) placed on an opposite face of a neighboring level (N1) while at least one electrolytic connection pad of a second type (20.1) on the add-on level (N2) passes through a coating layer (220) coating the sides of the electronic component (120) on the add-on level (N2) and directly electrically connects two conducting elements (z1, z2) located on each side of said coating layer (220).

72 Claims, 16 Drawing Sheets

(56) References Cited

U.S. PATENT DOCUMENTS

2010/0148340 A1* 6/2010 Takano et al. .............. 257/686
2010/0148352 A1* 6/2010 Moden .................... 257/692
2011/0175215 A1* 7/2011 Farooq et al. ............. 257/686
2011/0186978 A1* 8/2011 Kim et al. ................ 257/686

FOREIGN PATENT DOCUMENTS

| EP | 1 775 768 | 4/2007 |
| FR | 2 895 567 | 12/2005 |
| WO | 03/017647 | 2/2003 |
| WO | 2009/147148 | 12/2009 |

* cited by examiner

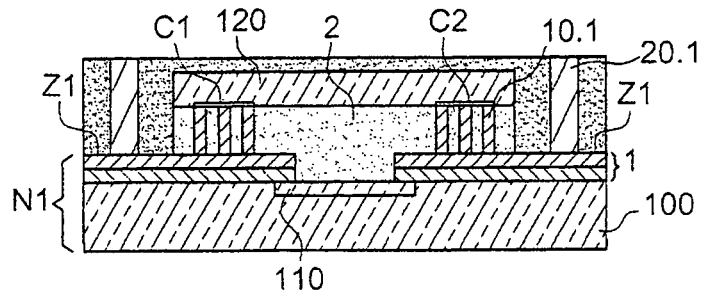
FIG. 8C
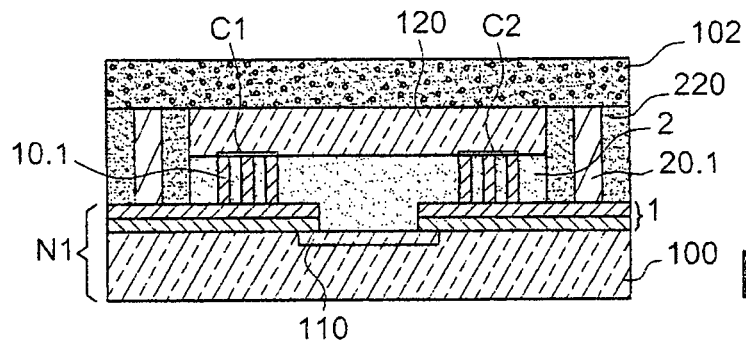
FIG. 9A1
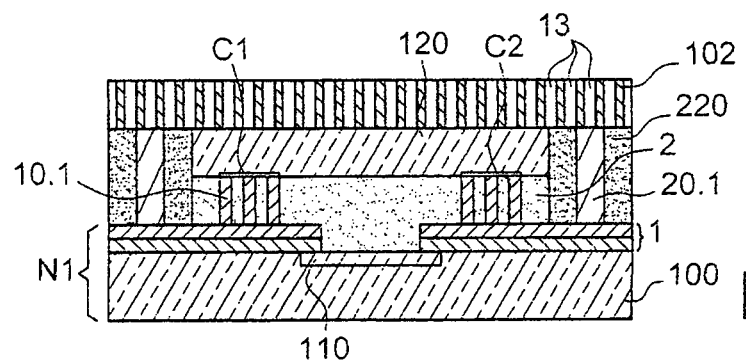
FIG. 9A2

STACKED ELECTRONIC DEVICE AND METHOD OF MAKING SUCH AN ELECTRONIC DEVICE

TECHNICAL DOMAIN

This invention relates to a stacked electronic device consisting of a stack of electronic components to be electrically connected to each other. An electronic component means any element that needs to be electrically connected to another element, for example an integrated circuit, a discrete passive or active component (MEMS, NEMS or other). The electronic component may for example comprise several independent electronic sub-elements.

STATE OF PRIOR ART

At the present time in stacked electronic devices that comprise more than two levels, electronic components are added onto each other through solder balls, wire connections or plating. Patent U.S. Pat. No. 5,311,401 discloses a method by which different components are electrically connected to each other through plating that extends along the sides of the stack. The integration densities of these electronic devices are too low. Furthermore, the presence of plating or solder balls limits the maximum temperature that can be used later during their manufacturing. Furthermore, compatibility problems between materials can arise particularly if lead is used. The solution presented in patent U.S. Pat. No. 5,311,401 is complex and is not collective, the electronic device cannot be manufactured by batch and then separated from its neighbours.

There are other electronic devices to increase the integration density, like those mentioned in U.S. Pat. No. 5,104,820. The electronic components are stacked and fixed together by gluing so as to approximately form cubes. Connections between two components are made by plating of one or several principal faces and then by etching conducting lines in the plating. Once again, the electronic device cannot be manufactured collectively and its cost is high. The method used is only cost effective for electronic devices with high added value.

Patent application EP 1 775 768 also discloses an electronic device formed from a basic substrate onto which three levels of electronic components are stacked. Only the first level of electronic components is connected to conducting tracks fitted with pads, supported by the base substrate. This connection is made by conducting micro-protuberances supported on one side by the pads and on the other side by the electronic component. The assembly is made using conducting glue at the protuberances and insulating adhesive elsewhere. Each other level of electronic components is assembled to the preceding component in the same way. It is not possible to connect a level of components to the substrate if it is not close to the substrate.

In American patent applications US 2003/0017647 and US 2004/0178495 the electronic components placed on a substrate are stacked and separated from each other by a dielectric layer, interconnections between one level and an adjacent level being made by solder balls, and interconnections between the substrate of one level and the substrate of another level being made by copper pads through plated vias.

One disadvantage of the structures disclosed in these documents is that a large number of metals are used to make the connections, these metals coming into direct contact in pairs. These documents mention copper, silver, titanium, nickel. There is a risk of corrosion appearing at the interface between these different metals. Another disadvantage is the complexity of the connections of different levels, that leads to expensive electronic devices with mediocre efficiency.

Yet another disadvantage is related to the use of solder balls. Their melting point is less than about 300° C., which limits the temperature that can be reached during subsequent steps after their formation. Furthermore, they lead to thick electronic devices because the spaces between levels due to the solder balls are large, of the order of not less than 50 to 100 micrometers.

PRESENTATION OF THE INVENTION

The purpose of this invention is to disclose a stacked electronic device with more than two levels with a high integration density that does not have the disadvantages mentioned above, particularly in terms of corrosion and cost.

Another purpose of the invention is to propose a stacked electronic device that is relatively thin, taking account of the number of stacked levels.

To achieve this, this invention is a stacked electronic device comprising stacked electronic components distributed on several levels each added on the preceding level, starting from a base level that may comprise at least one electronic component. At least one electrolytic connection pad of the first type on a given add-on level directly connects a conducting element placed on one face of an electronic component on the add-on level to a conducting element placed on an opposite face of a subjacent neighbouring level. Furthermore, at least one electrolytic connection pad of a second type on a given add-on level passes through a coating layer coating the sides of the electronic component on the given add-on level, and directly electrically connects two conducting elements located on each side of said coating layer, to each other. The stacked electronic device also comprises electrolytic connection pads of the first type on an add-on level directly superjacent to the given add-on level, and each is electrically connected to an electrolytic connection pad of the second type on the given add-on level.

Several electronic components may be located side by side on the same level.

It is preferable that the thickness of an electrolytic connection pad of the first type should be less than the thickness of an electrolytic connection pad of the second type, the thickness of this connection pad of the second type being dependent on the thickness of the electronic component adjacent to which it is located, so as to limit the thickness of the stacked electronic device.

An electrolytic connection pad of the first type may be a micro-insert or a set of micro-inserts in the form of a pin.

As a variant, an electrolytic connection pad of the first type may be a solder ball, if the temperature is not too restrictive. The solder ball may be made from a meltable material based on indium, lead-tin, lead-silver-copper or silver-tin-copper.

An electrolytic connection pad of the first type and/or an electrolytic connection pad of the second type may be made based on copper and/or nickel and/or gold.

An electronic component in an add-on level may be assembled to the subjacent neighbouring level by gluing.

A dielectric layer may coat the coating layer and the electronic component coated on the side by the coating layer on the given add-on level and may have at least one opening at the top of an electrolytic connection pad of the second type on the given add-on level.

At least one conducting track may extend on the dielectric layer and the opening, this conducting track possibly forming the conducting element placed on a face facing the add-on level directly superjacent to the given add-on level corresponding to one of the two conducting elements located on each side of said coating layer.

In order to facilitate manufacturing and reduce the cost and the thickness of the stacked electronic device, an electrolytic connection pad of the first type on the add-on level directly superjacent to the given add-on level may be located directly in line with an electrolytic connection pad of the second type on the given add-on level.

As a variant, an electrolytic connection pad of the first type on the add-on level directly superjacent to the given add-on level may be offset from an electrolytic connection pad of the second type on the given add-on level.

The conducting element placed on a face facing the given add-on level electrically connected to an electrolytic connection pad of the first type on the add-on level directly superjacent to the given add-on level, is preferably a conducting track that is also connected to the electrolytic connection pad of the second type on the add-on level directly superjacent to the given add-on level.

It is possible that the two electrolytic connection pads of the same type on different levels are in line with each other.

This invention also relates to a method for manufacturing a stacked electronic device comprising stacked electronic components distributed on at least one level on a base level that may contain at least one electronic component, in which:

a) at least one electrolytic connection pad of the first type is made on the base level by electrolysis, the electrolytic connection pad of the first type being in direct electrical contact with a conducting element on the base level;

b) at least one electronic component on the add-on level called the first add-on level is transferred onto the base level and is assembled such that a conducting element carried by one face of the electronic component is in direct electrical contact with the electrolytic connection pad of the first type made in step a);

c) at least one electrolytic connection pad of the second type is made by electrolysis on the base level, the electrolytic connection pad of the second type being in direct electrical contact with at least one second conducting element on the base level, this electrolytic connection pad of the second type being flush with or projecting beyond the electronic component on the first add-on level;

d) the electrolytic connection pad of the second type produced in step c) and the electronic component on the first add-on level are coated with a coating material, the top of the electrolytic connection pad of the second type being exposed, steps a) to d) only contributing to make the first add-on level;

e) electrolytic connection pads of the first type are made on the first add-on level by electrolysis, each electrolytic connection pad of the first type being in electrical contact with an electrolytic connection pad of the second type made in step c).

A connection pad of the first type made on the first add-on level may be in direct electrical contact with a first conducting element on the first add-on level.

The method may also comprise steps in which:

f) at least one electronic component is transferred from the second add-on level onto the first add-on level, and assembly is done such that a conducting element supported on one face of the electronic component is in direct electrical contact with the electrolytic connection pad of the first type made in step e);

g) at least one electrolytic connection pad of the second type is made on the first add-on level by electrolysis, the electrolytic connection pad of the second type being in direct electrical contact with a second conducting element on the first add-on level, this electrolytic connection pad of the second type being flush with or projecting beyond the electronic component on the second add-on level;

h) the electrolytic connection pad of the second type made in step g) and the electronic component on the second add-on level are coated with a coating material, the top of the electrolytic connection pad of the second type being exposed, these steps contributing to making the second add-on level.

If it is required that the stacked electronic device has more than two add-on levels, steps e) to h) may be repeated at least n times (where n is greater than or equal to two) so as obtain n+1 add-on levels, the first add-on level becoming the $(n-1)^{th}$ add-on level, the second add-on level becoming the $n^{th}$ add-on level, the base level becoming the $(n-2)^{th}$ level.

The electrolytic connection pad of the second type may be located outside the footprint occupied on the subjacent level by the electronic component on the add-on level.

In steps d) or h), the top of the electrolytic connection pad of the second type may be exposed by grinding at least the coating material and possibly the electronic component on the first add-on level and/or the second add-on level.

The first conducting element and/or the second conducting element on the base level can be made by etching a conducting base formed on the surface of the base level.

Similarly, the first conducting element and/or the second conducting element on the first add-on level may be made by etching a conducting base formed on the surface of the first add-on level, this conducting base being located above a dielectric layer open at the top of the electrolytic connection pad of the second type made in step g).

In some configurations, the first conducting element and the second conducting element in the base level may be coincident and/or the first conducting element and the second conducting element on the first add-on level may be coincident.

It would be possible to grow the electrolytic connection pad of the first type made in step e) directly on top of the electrolytic connection pad of the second type made in step c), by electrolysis.

A reflow step may be performed between step e) and step f) so that the connection pad of the first type made in step e) is transformed into solder balls, obviously provided that said connection pad of the first type is made from an appropriate material.

With some configurations, particularly if the electronic component to be added on is thin, it is possible that step b) can be performed after step c) and/or step f) can be performed after step g).

In a configuration in which the electronic component is thick, when step b) is performed before step c) and/or step f) is performed before step g), the electronic component can be thinned before step c) and/or step f).

When the stacked electronic device comprises several elementary stacked electronic devices, a total or partial cut-out of the stacked electronic device may be made after the last add-on level has been made, to separate the stacked elementary electronic devices from each other. The cut-out may be a cut-out of at least one conducting element designed to electrically separate the elementary stacked electronic devices.

BRIEF DESCRIPTION OF THE DRAWINGS

This invention will be better understood after reading the description of example embodiments given purely for guidance and in no way limitative, with reference to the appended drawings in which:

FIGS. 8A to 8C show a configuration in which an electronic component in one add-on level is particularly thin;

FIGS. 9A1, 9A2, 9B1, 9B2, 9C and 9D show configurations in which electrolytic connection pads of a first type on a given level are directly connected to electrolytic connection pads of a second type on the subjacent neighbouring level;

Identical, similar or equivalent parts of the different figures described below have the same numeric references so as to facilitate comparison of one figure with the next.

The different parts shown in the figures are not necessarily shown to the same scale, to make the figures more legible.

DETAILED PRESENTATION OF PARTICULAR EMBODIMENTS

Figure 1A:
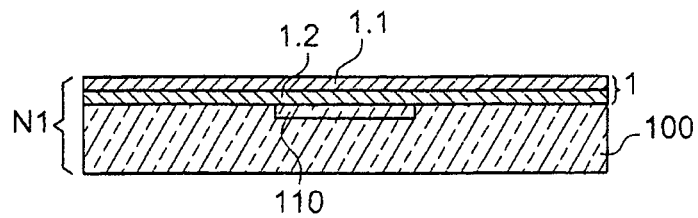
FIGS. 1A to 1K show steps in making the first add-on level of the stacked electronic device according to the invention.

We will now describe an example method of manufacturing a stacked electronic device according to the invention. We will start from a base substrate 100 that may or may not include an electronic component. This base substrate 100 contributes to materialising a base level N1. In the example described, we assume that an electronic component is integrated into this substrate 100, and it is referenced 110. A conducting base 1 is deposited on the surface of this base substrate 100. This conducting base 1 may be formed from a stack of two sub-layers 1.1, 1.2. For example, it may consist of an electrically conducting sub-layer 1.1 of the order of 300 nanometers thick, above a bond sub-layer 1.2. The electrically conducting sub-layer 1.1 may for example be copper-based. The bond sub-layer 1.2 may for example be based on titanium. The titanium-based bond sub-layer 1.2 may be of the order of 20 nanometers thick. This conducting base 1 will for example be used to make at least one contact element that may be connected to a contact of the electronic component 110 integrated into the substrate 100 or that may receive the electrical power supply for the stacked electronic device. All this is shown in FIG. 1A.

The next step will be to make one or several electrolytic connection pads 10.1 of a first type on the base substrate 100. These connection pads are qualified as electrolytic because they are made by electrolysis as is described below. These electrolytic connection pads 10.1 of the first type are designed to electrically connect a contact element of an electronic component that will be placed on a first add-on level N2 on the base level to begin to form the stack, to a contact element in the subjacent neighbouring level, in other words the base level N1. The first add-on level N2 is a neighbour of the base level N1 and is superjacent to the base level N1. The stacked electronic device according to the invention may comprise a single add-on level N2 or several levels stacked on each other.

Figure 1B:
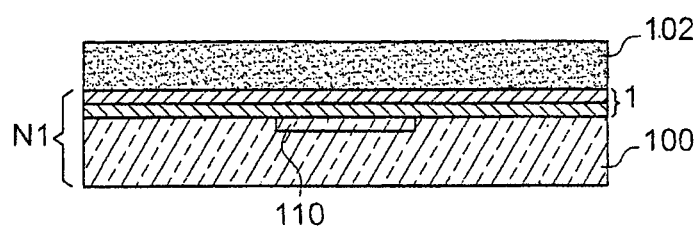
Figure 1C:
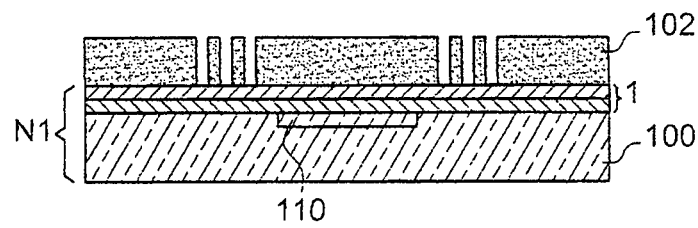

This is done by coating the conducting base 1 of the base level N1 with a resin layer 102, as shown in FIG. 1B. FIG. 1C shows a recessed pattern 11 formed in the resin layer 102 by lithography, for each electrolytic connection pad of the first type. These recessed patterns 11 are through holes in the resin 102 and reach the conducting base 1. It is preferable that the electrolytic connection pads 10.1 of the first type are formed from one or several pin-shaped micro-inserts coming out of the first subjacent level N1. The diameter of the micro-inserts may be of the order of 1 to 10 micrometers for a thickness of the order of 2 to 15 micrometers for the group.

Figure 1D:
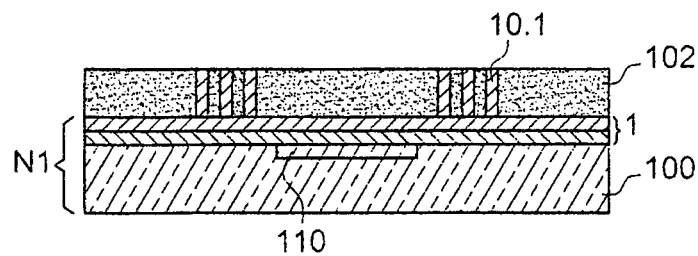
Figure 1E:
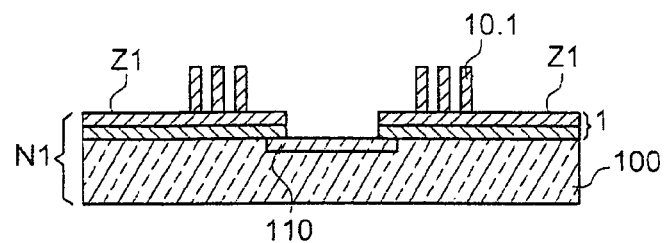

The recessed patterns 11 in the resin 102 are then filled with the material from which the electrolytic connection pad 10.1 of the first type is made, for example nickel and/or copper and/or gold, by electrolysis. Refer to FIG. 1D. The next step is to eliminate the resin layer 102 in FIG. 1E. A lithography step may be included at this stage, followed by etching in the conducting base 1 to delimit one or several conducting tracks $z_1$ connected to electrolytic connection pads 10.1 of the first type and possibly of the second type to be made later. This step is also shown in FIG. 1E. This step to delimit the conducting base 1 may be made before the formation of the electrolytic connection pads 10.1 of the first type.

At this stage, it is possible to add at least one electronic component 120 contributing to form the first add-on level N2, onto the electrolytic connection pads 10.1 of the first type previously formed on the base substrate 100. The transfer is preferably made at this stage if the add-on electronic component 120 is thin or thinned. If it is thick, in other words if it is thicker than the connection pads of the second type to be made later, it is preferable to make the transfer after these connection pads of the second type have been made. It has been assumed that the transfer has been made in FIG. 1F, but that it has not been made in FIGS. 1G and subsequent figures. If several electronic components are added on, they are placed side by side.

During the transfer of the electronic component 120 on the first add-on level N2, it is arranged so that its electrical contacts c1, c2 come into electrical contact with the first type of electrolytic connection pads 10.1 thus created. The electronic component 120 is assembled to the base level N1 using glue 2, for example BCB (benzocyclobutene) polymer or epoxy type glue. The assembly coats the electrolytic connection pads 10.1 of the first type. Therefore, the electrolytic connection pads 10.1 of the first type are covered by the electronic component 120.

Figure 1F:
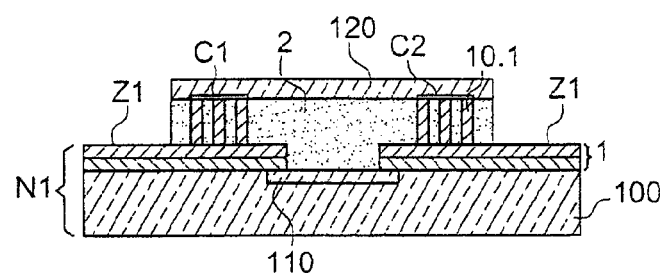
Figure 1G:
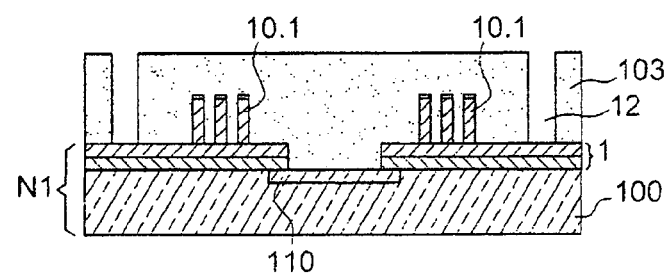

We will now refer to FIG. 1G that follows directly on from FIG. 1E, skipping the step shown in FIG. 1F. In FIG. 1G the electronic component on the first add-on level N2 has not yet been added on.

We will now make one or several electrolytic connection pads 20.1 of the second type that will electrically connect a given level N1 to another level of the stacked electronic device according to the invention. The electrolytic connection pads 20.1 of the second type may be located outside the footprint occupied by the electronic component 120 that has just been assembled (or that will be assembled) on the subjacent neighbouring level. As a variant, the electrolytic connection pads of the second type may pass through the electronic component 120 if it is designed for this. In the example described, the electrolytic connection pads 20.1 of the second type will connect tracks located on the base level N1 to other conducting tracks located above the electronic component 120 on the first add-on level N2. The diameter of the electrolytic connection pads 20.1 of the second type may be within a range varying from about 100 to 200 micrometers and their thickness may vary between about 50 and 150 micrometers. This thickness is approximately equal to the thickness of a layer of coating material coating the side of the electronic component 120 on the first add-on level N2. They pass through the thickness of this layer of coating material as will be seen later. The electrolytic connection pads 20.1 of the second type may be flush with or may project above the thickness of the electronic component 120 on the first add-on level N2.

Figure 1H:
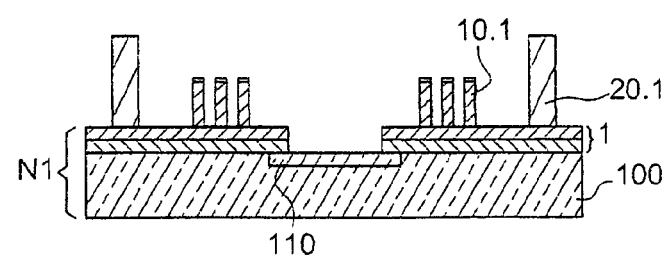

The electrolytic connection pads 20.1 of the second type are also made by lithography and electrolysis. Resin 103 is deposited on the surface of the base substrate 100 coated with the conducting base 1, and recessed patterns 12 are delimited within it corresponding to the electrolytic connection pads 20.1 of the second type. These recessed patterns 12 expose the conducting base 1 (FIG. 1G). These recessed patterns 12 are filled with metal, for example based on copper and/or nickel and/or gold, by electrolysis. The final step is to eliminate the resin 103 (FIG. 1H).

Delimitation may be done by lithography and etching of the conducting base 1 so as to delimit conducting tracks z1 associated particularly with the electrolytic connection pads 20.1 of the second type, and with electrolytic connection pads 10.1 of the first type if this etching step did not take place before the electrolytic connection pads 20.1 of the second type were made. This step may be qualified as a rerouting step. This step may be done by etching through a mask obtained by lithography.

Figure 1I:
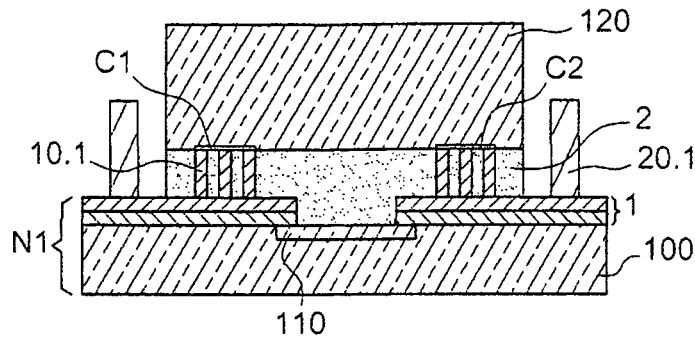

If the component 120 in the first add-on level N1 has not yet been added on, it will be added on now (FIG. 1I) and assembled. Assembly is done as described previously by gluing. The thickness of the electronic component 120 on the first add-on level N2 is greater than the thickness of the electrolytic connection pads 20.1 of the second type. The top of the electrolytic connection pads 20.1 of the second type does not reach the top of the electronic component 120 on the first add-on level N2. An optional grinding step may be performed to thin the electronic component 120 on the first add-on level N2. This step is not shown here, but it is shown in FIG. 7B.

Figure 1J:
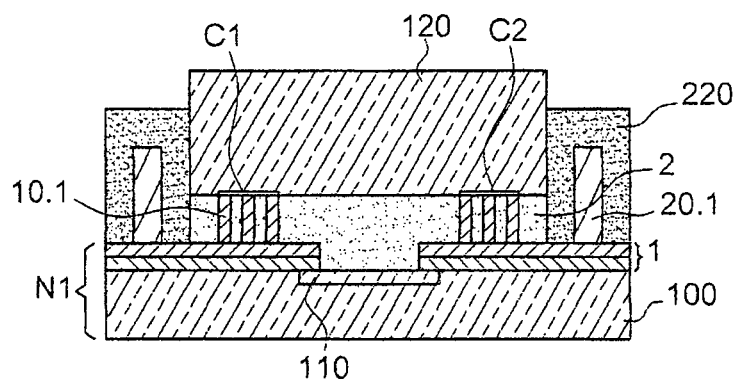

The next step is to coat electrolytic connection pads 20.1 of the second type and the electronic component 120 on the first add-on level N2 with a layer 220, for example made from epoxy type resin. Refer to FIG. 1J. This coating layer 220 will contribute to completing the first add-on level N2 of the stacked electronic device according to the invention; it coats the sides of the electronic component 120 on the first add-on level N2.

A grinding step (FIG. 1K), is done to reduce the thickness of the electronic component 120 on the first add-on level N2 and the tops of the electrolytic connection pads 20.1 of the second type are exposed. The second type of electrolytic connection pads 20.1 pass through the thickness of the coating layer 220. For example, the thickness of the electronic component 120 on the first add-on level N2 after the grinding step may be between about 40 and 60 micrometers. It is possible to stop at this step if there is only one add-on level N2. The process can be continued if there are several add-on levels, chaining the next steps.

Figure 2A:
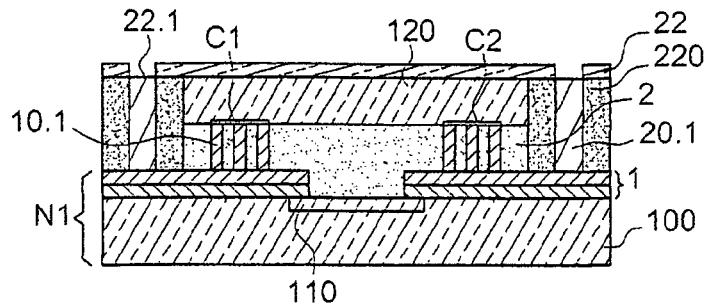
FIGS. 2A, 2B show optional steps to finish the first add-on level of the stacked electronic device according to the invention.

As shown in FIG. 2A, the next step may be to form a dielectric layer 22 that extends over the entire ground surface, and to etch it locally to expose the connection pads 20.1 of the second type. At least one opening is obtained by etching and is referenced 22.1. Etching may be done through a mask obtained by lithography. The dielectric layer 22 may be between about 0.2 and 20 micrometers thick. This dielectric layer 22 may be organic, for example it may be made from BCB (benzocyclobutene) or it may be made from an epoxy resin, or it may be inorganic for example silicon nitride SiN or silicon oxide $SiO_2$.

Figure 2B:
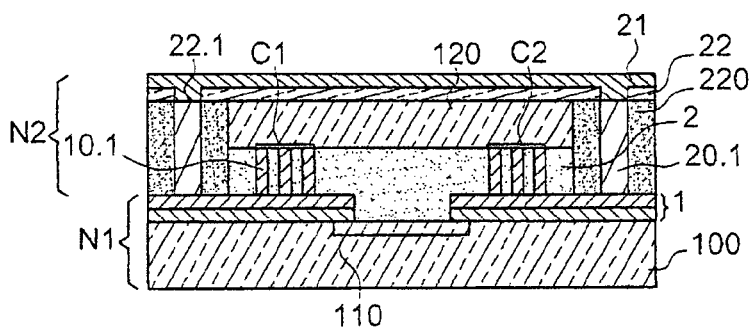

The first level N2 added onto the base level N1 is terminated by coating the structure in FIG. 2A with a conducting base 21 as previously shown in FIG. 1A. Refer to FIG. 2B.

The conducting base may be multi-layer, with the bond sub-layer being applied first.

The next step is to make the second add-on level N3.

Figure 3A:
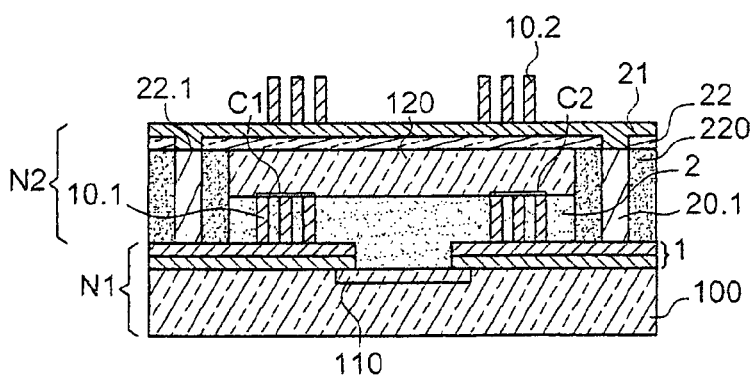
FIGS. 3A to 3E show steps in making the second add-on level of the stacked electronic device according to the invention.

The starting point is to make several electrolytic connection pads 10.2 of the first type as described with reference to FIGS. 1B-1E (FIG. 3A) on the first add-on level N2.

Each of these electrolytic connection pads 10.2 of the first type in the second add-on level is electrically connected to an electrolytic connection pad 20.1 of the second type on the first add-on level N2. Electrolytic growth takes place from a conducting base 21, the conducting base being used as an electrode for electrolytic growth. Moreover, the conducting base 21 is used to make the electrical contact between each electrolytic connection pad of the first type 10.2 and an electrolytic connection pad of the second type 20.1 on the first add-on level N2.

Compared with another configuration in which only a few electrolytic connection pads 10.2 of the first type on the second add-on level N3 are electrically connected to an electrolytic connection pad 20.1 of the second type on the first add-on level N2 but not to others, the invention can provide electrical continuity between the electrolytic connection pads of the first type and of the second type. This configuration can be used in particular to perform electrolysis of connection pads of the first and the second types starting from the single continuous conducting base 21, which in particular can reduce costs. Obviously, this electrolysis may also be done for pads in the add-on level starting from the conducting element z2, particularly to avoid exposing layer 1 which could be covered by successive deposits.

As a variant, as will be seen later, a pad may be directly connected to an electrolytic connection pad of the second type in the subjacent level.

Figure 3B:
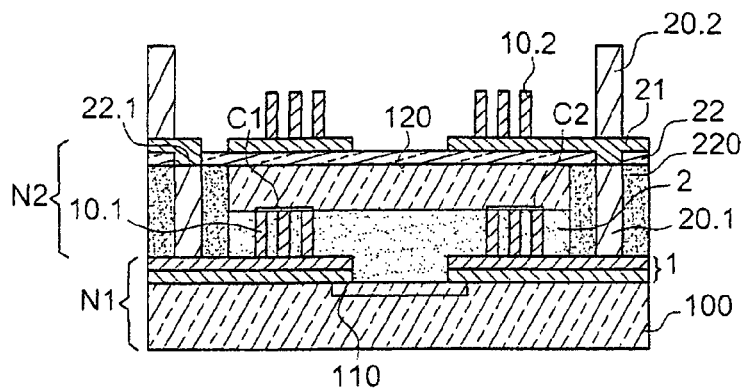

FIG. 3B shows one or several electrolytic connection pads 20.2 of the second type as described with reference to FIGS. 1G and 1H.

A step to etch the conducting base 21 is done to delimit conducting tracks z2 electrically connected to the electrolytic connection pads 10.2 of the first type and/or the electrolytic connection pads 20.2 of the second type. An electrolytic connection pad 20.2 of the second type on one level, for example the second add-on level N3, may be connected through a conducting track z2 to an electrolytic conducting pad 10.2 of the first type on the same level N3 as itself or to a level other than its own, or to an electrolytic connection pad of the second type on a level other than its own. The etching step may be done in two steps, one after the electrolytic connection pads 10.2 of the first type have been made and the second after the electrolytic connection pads 20.2 of the second type have been made. It would have been possible to envisage performing the step for delimiting the conducting base 21 before the electrolytic connection pads 10.2 of the first type had been made on the second add-on level N3.

Figure 3C:
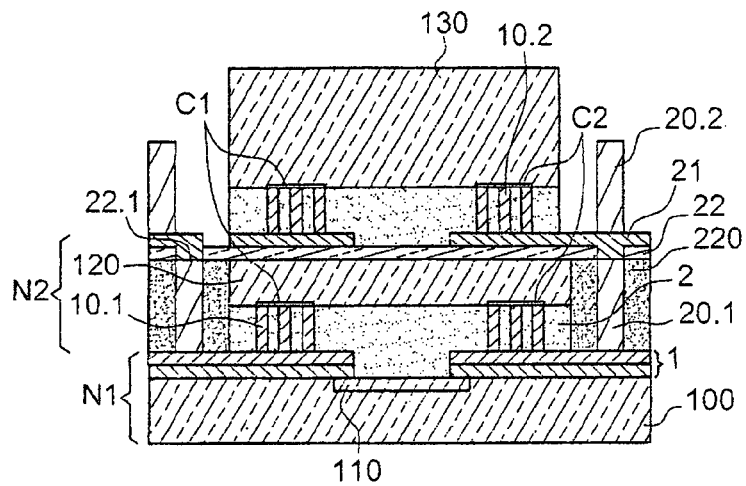

FIG. 3C shows one or several electronic components 130 on the second add-on level N3 on the electrolytic connection pads 10.2 of the first type that have just been made. Obviously, this step could have been done before the electrolytic connection pads 20.2 of the second type were made. The glue used for assembly of the electronic component is denoted reference 3.

An optional step to grind the electronic component 130 on the second add-on level N3 may be performed at this stage, but this step is not compulsory.

Figure 3D:
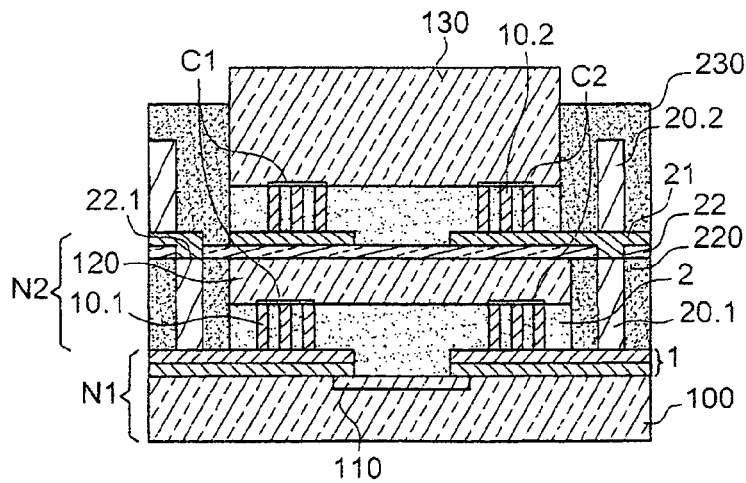
Figure 3E:
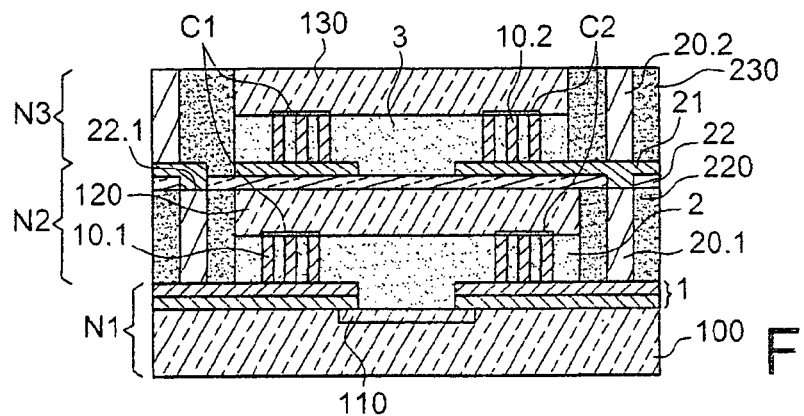

FIG. 3D shows coating of the electrolytic connection pads 20.2 of the second type and the electronic component 130 that has just been added on, this coating may be made with epoxy resin and the coating layer is denoted reference 230. A grinding step shown in FIG. 3E is done during which the thickness of the second add-on level N3 is adjusted so that the tops of electrolytic connection pads 20.2 of the second type are exposed. The process will then stop if the stacked electronic device according to the invention does not contain any other levels, since the second add-on level N3 is terminated. The electrolytic connection pads 20.2 of the second type that are accessible can be used as contacts, for example to be connected to an energy source or to another electronic device.

Figure 4A:
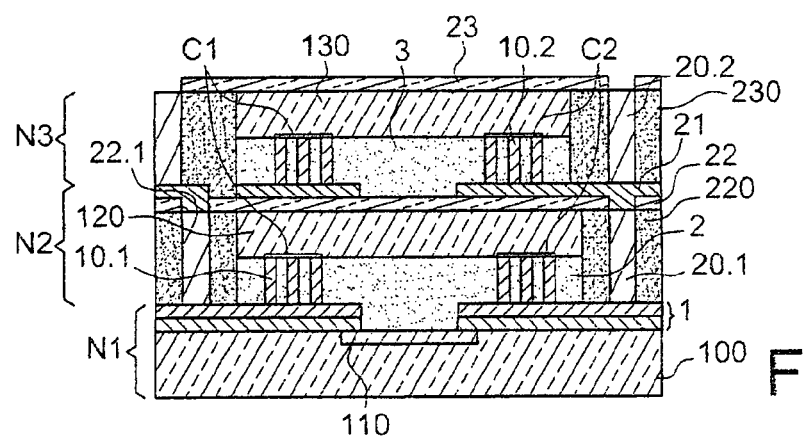
FIGS. 4A, 4B show optional steps to finish the second add-on level of the stacked electronic device according to the invention.

If the stacked electronic device according to the invention comprises at least a third add-on level N4 superposed on the second add-on level N, then a dielectric layer 23 can be formed that extends over the entire ground surface. Openings can be provided locally by etching to expose the tops of the electrolytic connection pads 20.2 of the second type (FIG. 4A). Etching may be done through a mask obtained by lithography.

The second add-on level N3 (FIG. 4B) can be terminated by depositing a conducting base 21 as previously shown in FIG. 2B.

The next step is to make a third add-on level N4.

Figure 4B:
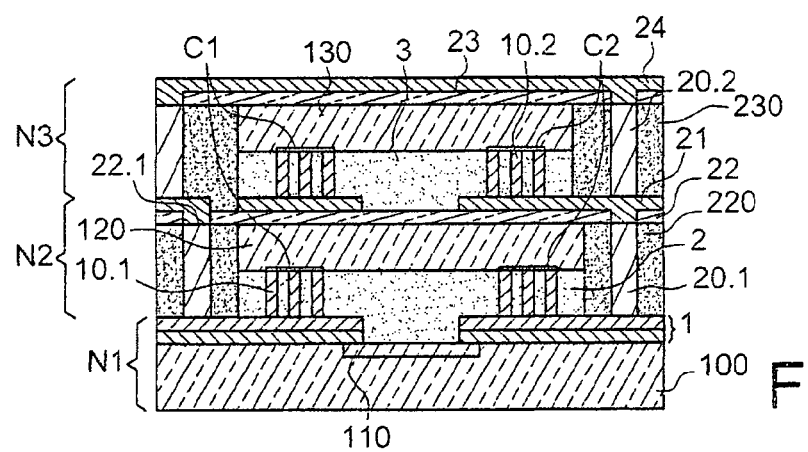

These steps in FIGS. 4A, 4B are optional, particularly if the electrolytic connection pads of the first type that will be made in the next steps are implanted directly on the electrolytic connection pads of the second type on the second add-on level N3.

Figure 5A:
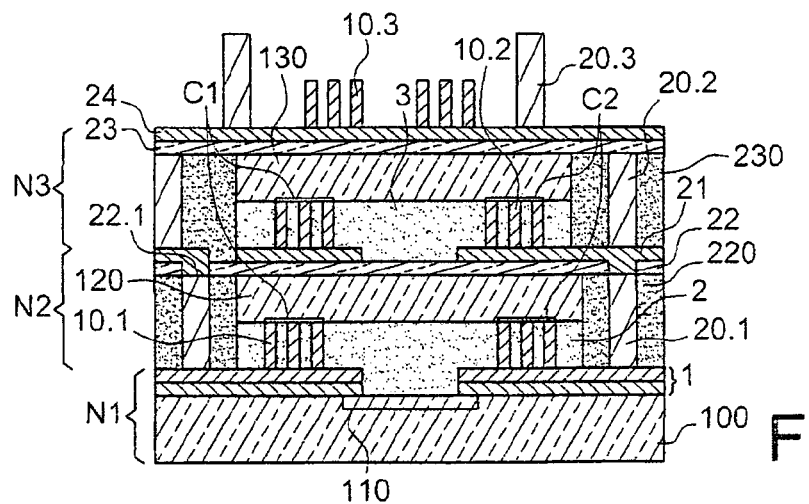
FIGS. 5A to 5D show steps to make the third add-on level of the stacked electronic device according to the invention.
Figure 5B:
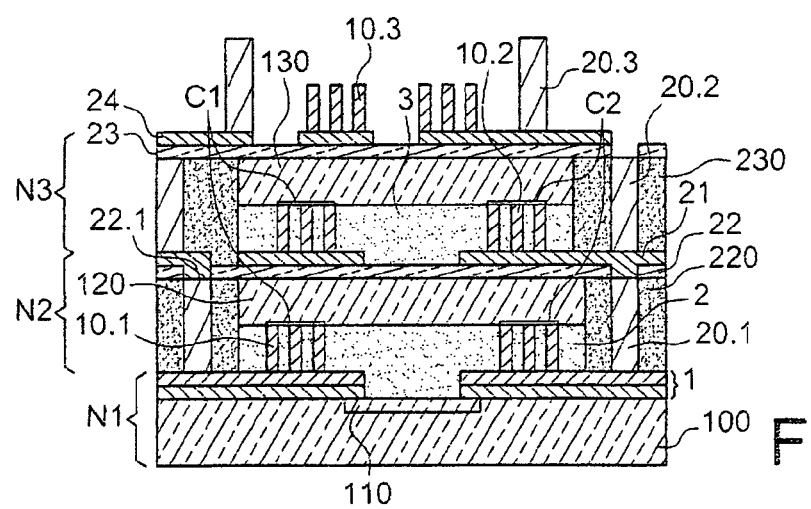

As above, one or several electrolytic connection pads of the first type 10.3 and one or several electrolytic connection pads of the second type 20.3 are made (FIG. 5A). In FIG. 5B, the conducting base 21 is etched so as to delimit the conducting tracks z3 that come into contact with the electrolytic connection pads 10.3 of the first type and/or the electrolytic connection pads 20.3 of the second type. A rerouting step is thus done.

Figure 5C:
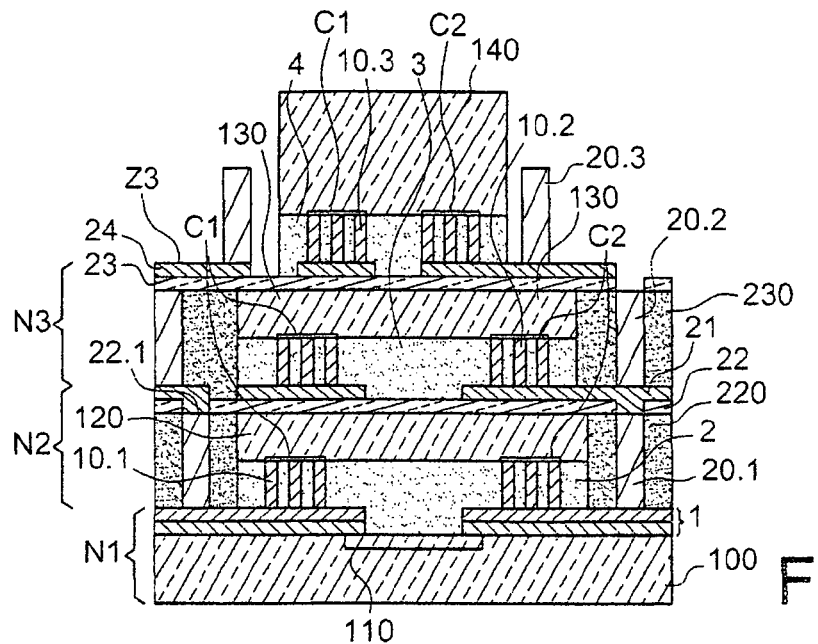

In the example described and as shown in FIG. 5C, after the electrolytic connection pads 20.3 of the second type have been made and after rerouting, at least one electronic component 140 on the third add-on level N4 is added onto the electrolytic connection pads 10.3 of the first type and they are assembled by gluing. The same method is used as in FIG. 1F. If the thickness of the electronic component 140 is greater than the thickness of the electrolytic connection pads 20.3 of the second type, a grinding step can be performed immediately in order to thin it. Once again, the electronic component 140 on the third add-on level N4 could have been added on previously, before the electrolytic connection pads 20.3 of the second type were made.

Figure 5D:
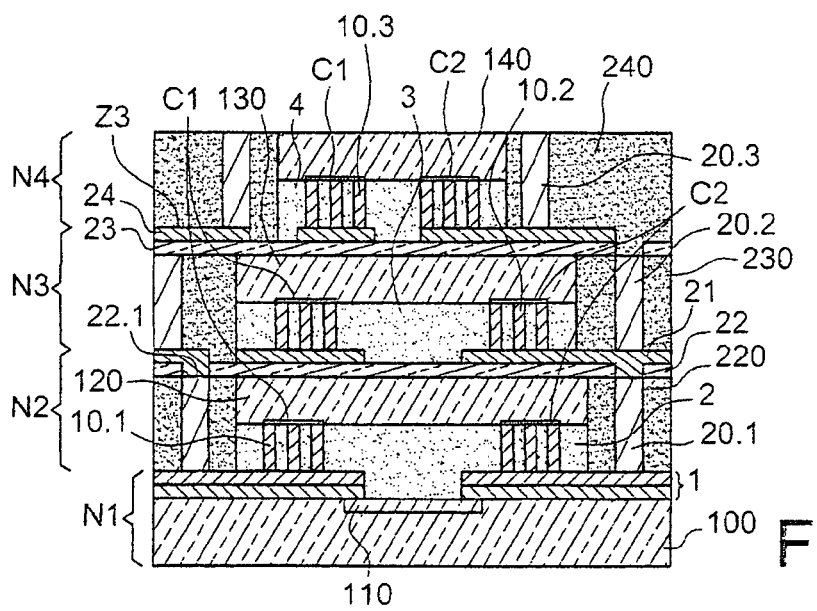

The next step is to coat the electrolytic connection pads 20.3 of the second type and the electronic component 140 on the third add-on level N4 with resin, for example an epoxy type resin, as shown in FIG. 5D. The coating layer is denoted reference 240. This coating layer 240 will contribute to completing the third add-on level N4 in the stacked electronic device according to the invention. It coats the side of the electronic component 140.

A grinding step, also shown in FIG. 5D, exposes the top of the second type of electrolytic connection pads 20.3. This grinding step may also contribute to thinning the electronic component 140 in the third add-on level N4. Electrolytic connection pads 20.3 of the second type pass through the coating layer 240.

The stacked electronic device according to the invention may be terminated after this step. Obviously, it would be possible to envisage adding on one or several other levels, and each additional level may be made by repeating the procedure described above for the second add-on level or for the third add-on level, or as disclosed in the following description that includes some variants.

A level of the electronic device according to the invention that has just been described, that is at a distance from the base level can thus be electrically connected to the base level N1 provided that two electrolytic connection pads 20.1, 20.2 of the second type in different neighbouring levels are in line with each other as shown in FIGS. 3B to 4B.

If several elementary stacked electronic devices to be separated have been made collectively on a single base substrate 100, the stack obtained can be totally or partially cut with a saw S to separate them. The saw lines S may be selected to disconnect electrolytic connection pads of the first type or electrolytic connection pads of the second type previously connected to each other by conducting tracks z1, z2, . . . without eventually leading to pieces that are completely separated from each other. This provides a means of electrically isolating electronic components from each other particularly when electronic growth is done from the same conducting layers.

Figure 6A:
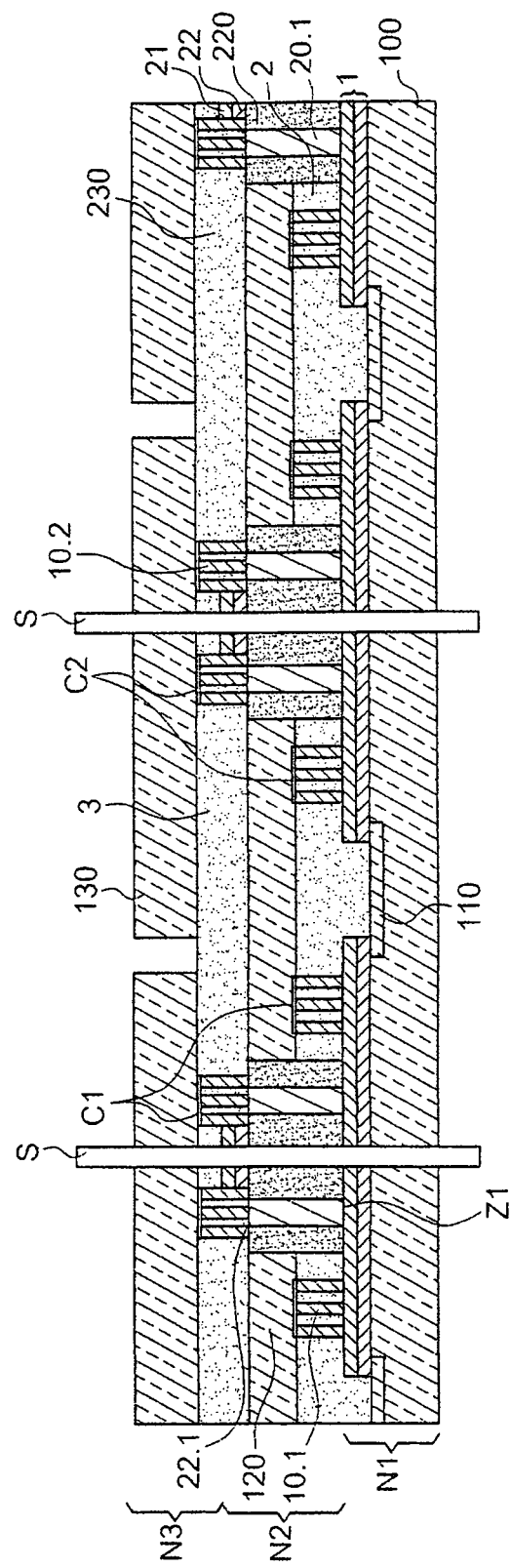
FIGS. 6A, 6B show steps to obtain elementary stacked electronic devices according to the invention by cutting.
Figure 6B:
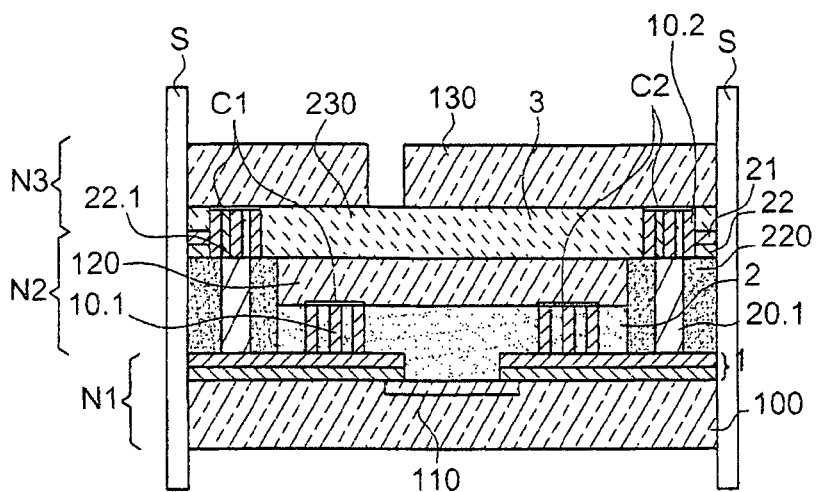

In FIGS. 6A, 6B the stack only comprises two add-on levels N2, N3. The break of the conducting track reference z2 between the two electrolytic connection pads 20.1 of the second type can be clearly seen in FIGS. 6. The saw line S has split an add-on electronic component into two, as shown in FIG. 6A with the electronic component 120. The result obtained is a plurality of individual stacked electronic devices, and one of them is shown in FIG. 6B.

Obviously, it would be possible to add two adjacent electronic components 120 per level as shown in FIG. 6A. The two electronic components 130 are placed side by side on the same level.

Figure 7A:
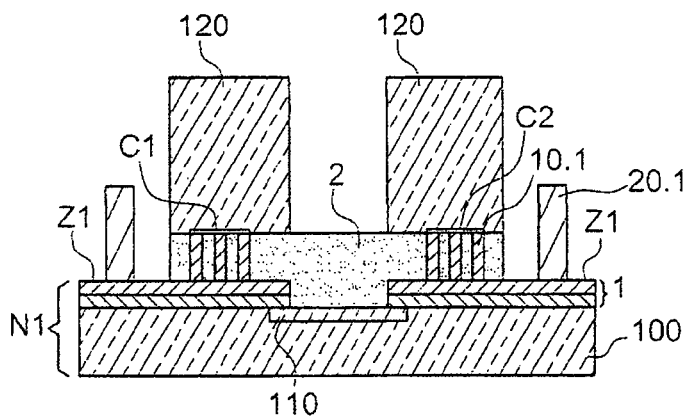
FIGS. 7A to 7C show a configuration in which an electronic component in one add-on level is particularly thick.
Figure 7B:
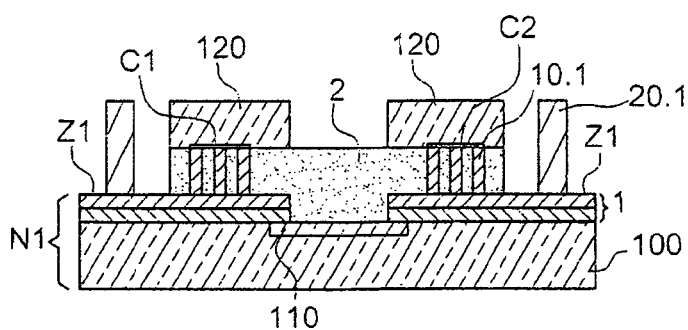
Figure 7C:
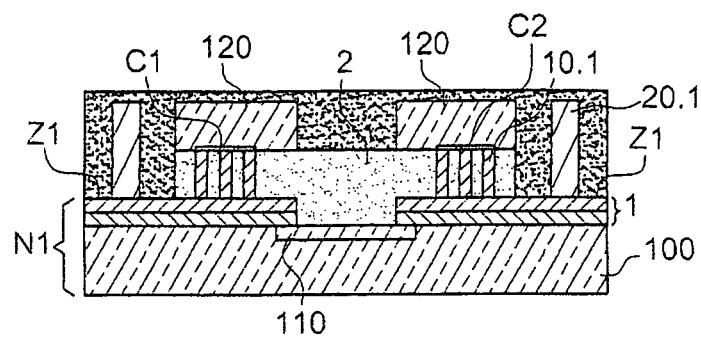

If at least one electronic component 120 in one level is particularly thick as shown in FIG. 7A, a grinding step (FIG. 7B) of the electronic component 120 can take place to thin it before the coating step (FIG. 7C). The thickness of the electronic component 120 may remain greater than the thickness of the electrolytic connection pads 20.1 of the second type before coating.

Figure 8A:
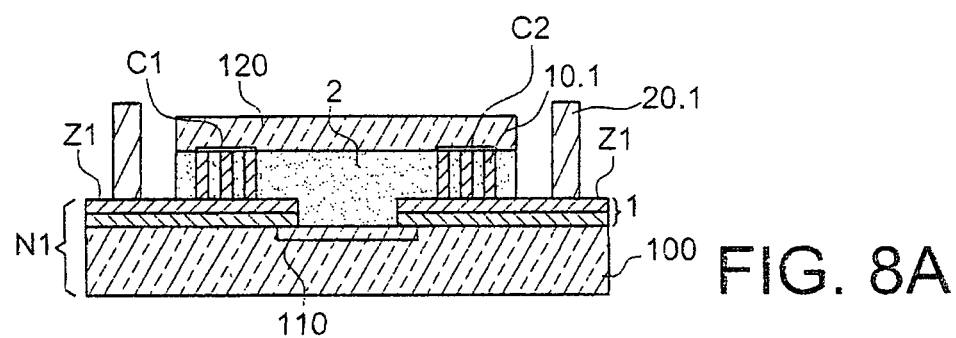
Figure 8B:
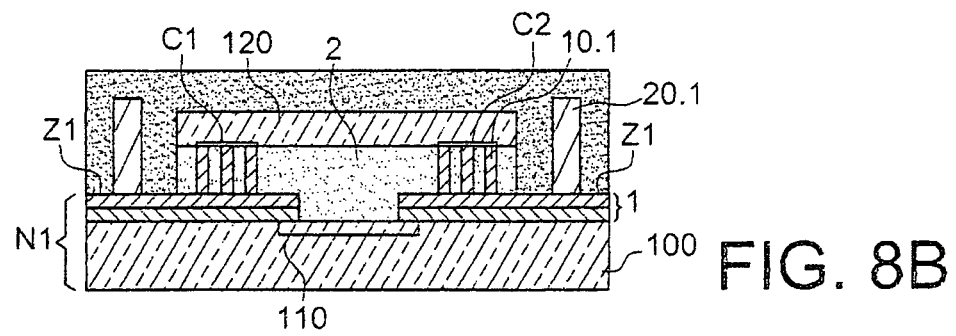

As a variant shown in FIG. 8A, the thickness of the electronic component 120 is less than the thickness of the electrolytic connection pads 20.1 of the second type. Therefore, there is no grinding step prior to the coating step (FIG. 8B). The grinding step (FIG. 8C) that follows the coating step does not attack the electronic component 120.

According to another variant, it is possible that one or several electrolytic connection pads 10.2 of the first type implanted on an add-on level N2 can be made directly on electrolytic connection pads 20.1 of the second type on said add-on level N2. They are directly in line with the electrolytic connection pads 20.1 of the second type as shown in FIGS. 9B1, 9B2, 9C and 9D. Therefore in this configuration, neither a dielectric layer nor a conducting base are made following the grinding step as was described with reference to FIGS. 2A and 2B. All that is done is to grow the electrolytic connection pads 10.2 of the first type on a given level by electrolysis directly on the electrolytic connection pads 20.1 of the second type in the subjacent level. The electrolytic connection pads 20.1 of the second type on the subjacent level are used as electrodes for electrolytic growth.

Figure 1K:
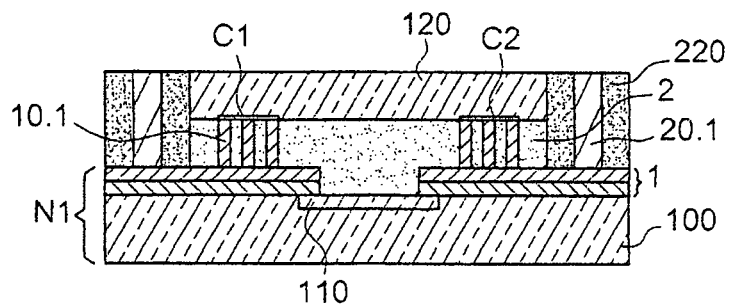

Subsequent to the grinding step that exposes the electrolytic connection pads 20.1 on the first add-on level N2 shown in FIG. 1K, the ground structure is coated with resin 102 (FIG. 9A1). As shown in FIG. 9B1, a recessed pattern 13 is formed by lithography in the resin layer 102, for each of the electrolytic connection pads 10.2 of the first type to be made. The recessed patterns 13 in the resin 102 expose the tops of the electrolytic connection pads 20.1 of the second type. They are then filled with material from which the electrolytic connection pad 10.2 is made, for example based on nickel and/or copper and/or gold, by electrolysis. Refer to FIG. 9B1. The electrolytic connection pads of the first type 10.2 are not necessarily formed from the same material as the electrolytic connection pads 20.1 on top of which they are located.

As a variant shown in FIGS. 9A2 and 9B2, it is possible to make a plurality of recessed patterns 13 distributed over the entire surface of the resin layer 102 (FIG. 9A2). The recessed patterns 13 located above the second type of electrolytic connection pads 20.1 expose them. This avoids alignment problems. During filling by electrolysis, only the patterns located above the electrolytic connection pads 20.1 of the second type will be filled because the recessed patterns open up onto an electrically conducting and polarised surface.

Figure 9C:
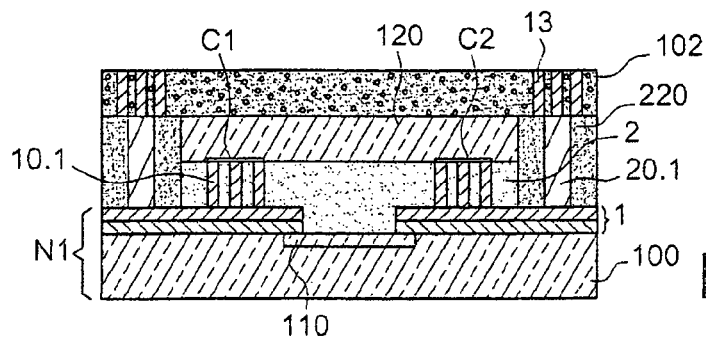
Figure 9C:
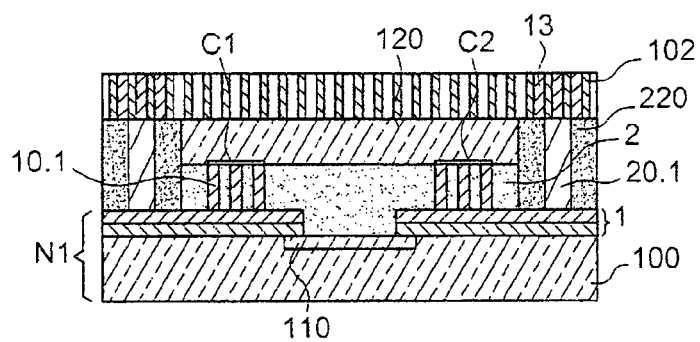
Figure 9C:
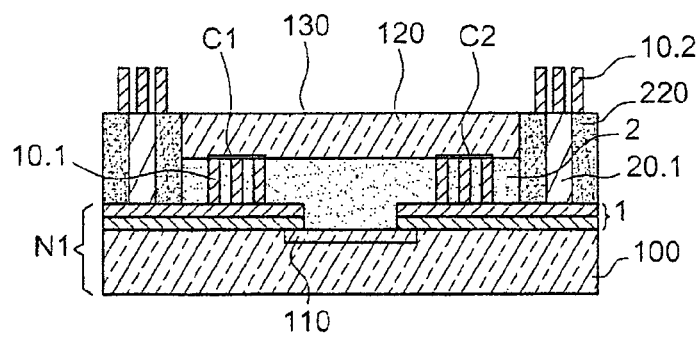
Figure 9D:
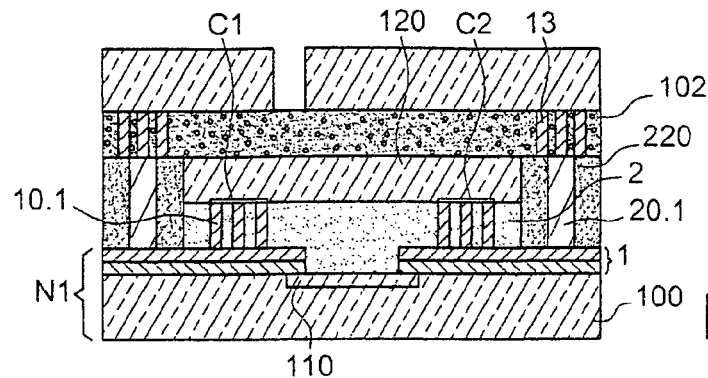

The next step is to eliminate the resin layer 102 in FIG. 9C. One or several electronic components 130 on the second add-on level N3 can then be added on and assembled (FIG. 9D). Contact elements between add-on electronic components 130 are placed such that they come into electrical contact with the electrolytic connection pads 10.2 of the first type thus created.

In FIG. 9, the electrolytic connection pads 10.2 of the first type on the second add-on level are still micro-inserts. Obviously, it would be possible for the electrolytic connection pads of the first type to be solder balls if temperature is not a constraint. Refer to FIGS. 10A to 10D. This series of figures is specific to a configuration similar to that described above in which the electrolytic connection pads of the first type implanted on the add-on level are directly in line with the electrolytic connection pads of the second type in said add-on level. Obviously, it would be possible for the solder balls to be offset from the tops of the electrolytic connection pads of the second type in a subjacent add-on level as described above with reference to FIG. 11, but each of them is electrically connected to an electrolytic connection pad of the second type in the subjacent level.

We will now refer to FIG. 10. There is no deposited conducting base after the grinding step in this configuration either, because the electrolytic connection pads 10.2 of the first type are in line with the electrolytic connection pads 20.1 of the second type on the subjacent level.

Figure 10A:
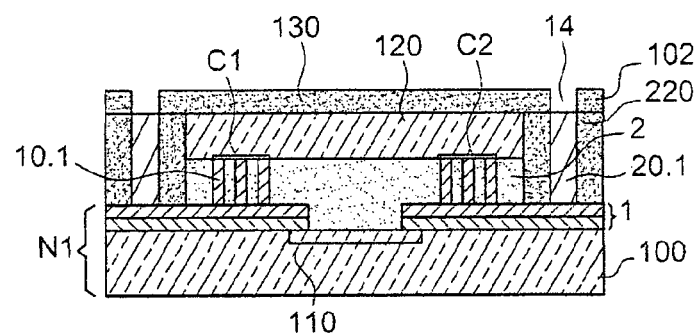
FIGS. 10A to 10D show a configuration in which the electrolytic connection pads of the first type are solder balls.
Figure 10B:
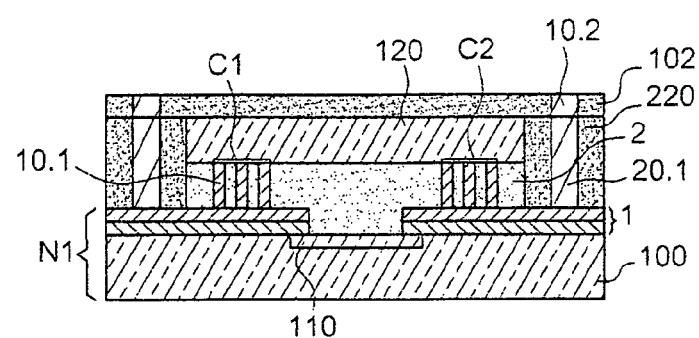
Figure 10C:
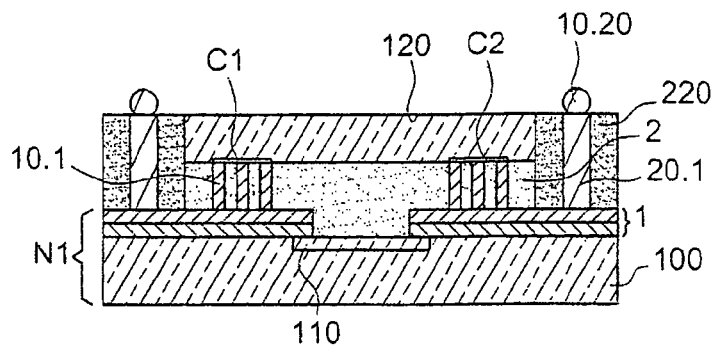

After the grinding step that exposed the electrolytic connection pads 20.1 of the second type on the first add-on level N2, shown in FIG. 1K, the ground structure is coated with resin 102 (FIG. 10A). The resin thickness is between about 20 and 100 micrometers. In FIG. 10A, the next step is to use lithography to form a recessed pattern 14 in the resin layer 102 for electrolytic connection pads that will subsequently be transformed into solder balls. The recessed patterns 14 in the resin 102 are then filled with meltable conducting material making up solder balls, for example indium In, or an alloy based on tin and lead SnPb, tin, silver and copper SnAgCu, lead, silver and copper PbAgCu. In electronics, a meltable conducting material is a conducting material that will melt at a sufficiently low temperature to prevent degradation of the components that will be assembled with this material. An expert in electronics will be perfectly aware of what a meltable conducting material means. Refer to FIG. 10B. The next step is to eliminate the resin layer 102 in FIG. 10C and to form the solder balls 10.20 by reflow.

Figure 10D:
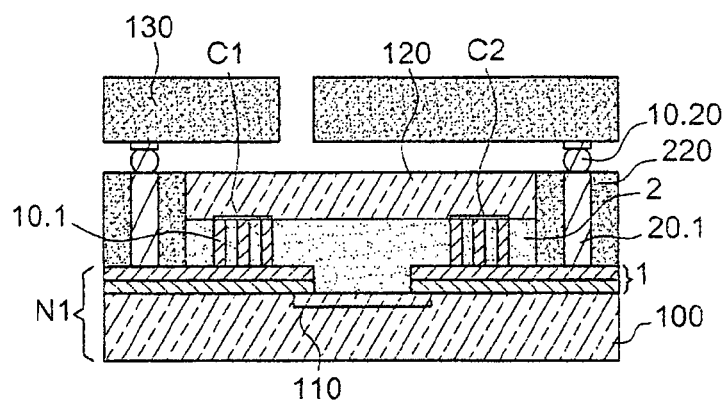

One or several electronic components 130 on the second add-on level N3 can then be added onto the first add-on level N2 by soldering, making use of the solder balls 10.20 (FIG. 10D). Contact elements 50 of the add-on electronic components 130 are put into place so that they come into electrical contact with the solder balls type 10.20 thus created.

Figure 11A:
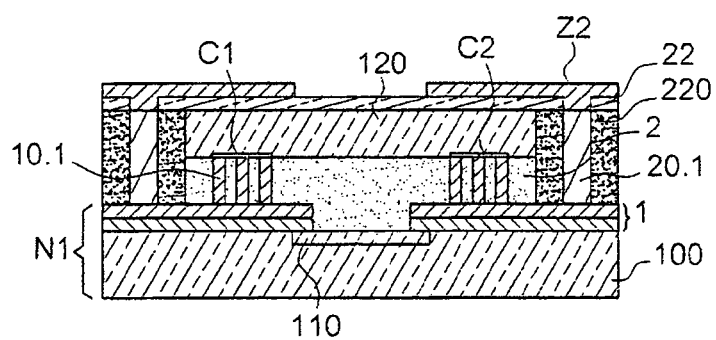
FIGS. 11A to 11C show a configuration in which the electrolytic connection pads of a first type on an add-on level are electrically connected to electrolytic connection pads of a second type in the subjacent neighbouring level, and are offset from them.
Figure 11B:
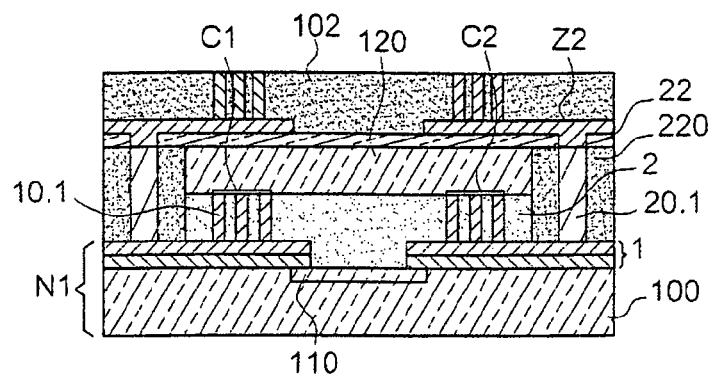
Figure 11C:
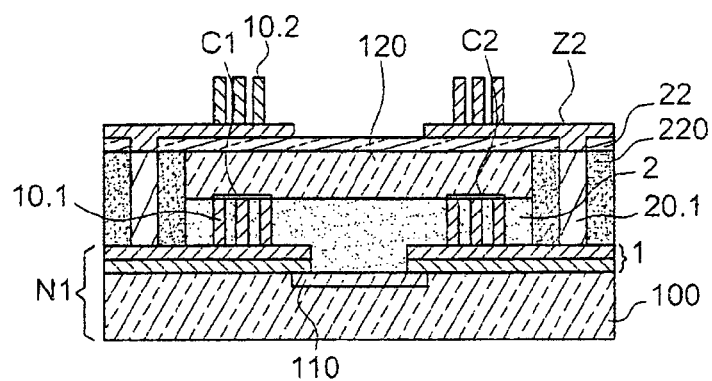

We will now describe yet another variant with reference to FIG. 11 that concerns manufacturing of electrolytic connection pads of a first type formed on an add-on level. Each of these electrolytic connection pads of the first type will be electrically connected to an electrolytic connection pad of the second type on the level 20.1 on which it is implanted. The electrolytic connection pads of the first type will be offset from the electrolytic connection pads 20.1 of the second type. As described with reference to FIGS. 2A, 2B, 3A, a dielectric layer 22 is deposited on the ground structure after the grinding step, openings 14 are etched on the top of the electrolytic connection pads 20.1 of the second type to expose them, the conducting base 21 is formed on the ground structure partially coated with the dielectric layer 22, and it is modelled to make conducting tracks z2 that reroute towards the electrolytic connection pads of the first type to be made later (FIG. 11A).

Finally, said first type of electrolytic connection pads 10.2 are made by lithography and electrolysis as described above (FIGS. 11B and 11C). The difference from the description of FIGS. 2 and 3 is that the conducting base 21 is modelled before the electrolytic connection pads 10.2 of the first type are made.

Figure 12:
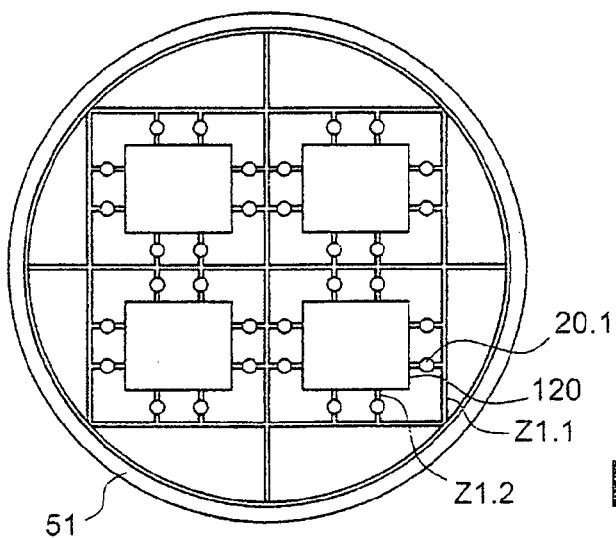
FIG. 12 shows a top view of a stacked electronic device according to the invention during manufacturing.

FIG. 12 shows a top view of a stacked electronic device made according to the invention currently being manufactured. The base support 100 is in the form of a disk and it comprises a peripheral conducting ring 51. The electronic components 120 on the first add-on level N2 can be seen. Segments z1.2 are segments of conducting tracks z1 connecting electronic components 120 through electrolytic connection pads of the first type (not shown because they are concealed under the components 120) to electrolytic connection pads 20.1 of the second type. Segments z1.1 are segments of conducting tracks z1 connecting electrolytic connection pads 20.1 of the second type to the peripheral ring 51.

Although several embodiments of this invention have been represented and described in detail, it will be understood that different changes and modifications can be made without going outside the scope of the invention. In particular, some steps of the process may take place in a different order.

Furthermore, the different variants described must be understood as not necessarily being exclusive of each other.

The invention claimed is:

1. Stacked electronic device comprising stacked electronic components (120, 130) distributed on several added-on levels (N2, N3) each added on the preceding level starting from a base level (N1) that may contain at least one electronic component (110), in which at least one electrolytic connection pad of the first type (10.1) on a given add-on level (N2) directly connects a conducting element (c1, c2) placed on one face of an electronic component (120) on the add-on level (N2), to a conducting element (z1) placed on an opposite face of a subjacent neighbouring level (N1), while at least one electrolytic connection pad of a second type (20.1) on the given add-on level (N2) passes through a coating layer (220)

coating the sides of the electronic component (110) on the given add-on level (N2) and directly electrically connects two conducting elements (z1, z2) located on each side of said coating layer (220), characterised in that it also comprises electrolytic connection pads of the first type (10.2) on an add-on level (N3) directly superjacent to the given add-on level (N2), and each is electrically connected to an electrolytic connection pad of the second type (20.1) on the given add-on level (N2), and in that the electrolytic connection pads of the first type are formed from several pin-shaped micro-inserts.

2. Stacked electronic device according to claim 1, in which several electronic components (130) are located side by side on a single level.

3. Electronic device of the first type according to claim 1, in which the thickness of an electrolytic connection pad of the first type (10.1) is less than that of an electrolytic connection pad of the second type (20.1).

4. Electronic device of the first type according to claim 2, in which the thickness of an electrolytic connection pad of the first type (10.1) is less than that of an electrolytic connection pad of the second type (20.1).

5. Stacked electronic device according to claim 1, in which an electrolytic connection pad of the first type (10.1) and/or an electrolytic connection pad of the second type (20.1) are made based on copper and/or nickel and/or gold.

6. Stacked electronic device according to claim 1, in which an electronic component (110) in an add-on level (N2) is assembled to the subjacent neighbouring level (N1) by gluing.

7. Stacked electronic device according to claim 2, in which a dielectric layer (22), coating the coating layer (220) and the electronic component (120) coated on the side by the coating layer (220) on the given add-on level (N2), has at least one opening at the top of an electrolytic connection pad of the second type (20.1) on the given add-on level (N2).

8. Stacked electronic device according to claim 7, in which at least one conducting track (z2) extends on the dielectric layer (22) and the opening, this conducting track (z2) possibly forming the conducting element placed on a face facing the add-on level (N3) directly superjacent to the given add-on level (N2) corresponding to one of the two conducting elements located on each side of said coating layer (220).

9. Stacked electronic device according to claim 2, in which an electrolytic connection pad of the first type (10.2) on the add-on level (N3) directly superjacent to the given add-on level (N2) is located directly in line with an electrolytic connection pad of the second type (20.2) on the given add-on level (N2) and is directly connected to this pad of the second type.

10. Stacked electronic device according to claim 2, in which an electrolytic connection pad of the first type (10.3) on the add-on level (N3) directly superjacent to the given add-on level (N2) is offset from an electrolytic connection pad of the second type (20.2) on the given add-on level (N2).

11. Stacked electronic device according to claim 2, in which a conducting element (z2) placed on a face facing the given add-on level (N2) electrically connected to an electrolytic connection pad of the first type (10.2) on the add-on level (N3) directly superjacent to the given add-on level (N2) is a conducting track that is also connected to the electrolytic connection pad of the second type (20.2) on the add-on level (N3) directly superjacent to the given add-on level (N2).

12. Stacked electronic device according to claim 2, in which two electrolytic connection pads of the same type on different levels are in line with each other.

13. Stacked electronic device comprising stacked electronic components (120, 130) distributed on several added-on levels (N2, N3) each added on the preceding level starting from a base level (N1) that may contain at least one electronic component (110), in which at least one electrolytic connection pad of the first type (10.1) on a given add-on level (N2) directly connects a conducting element (c1, c2) placed on one face of an electronic component (120) on the add-on level (N2), to a conducting element (z1) placed on an opposite face of a subjacent neighbouring level (N1), while at least one electrolytic connection pad of a second type (20.1) on the given add-on level (N2) passes through a coating layer (220) coating the sides of the electronic component (110) on the given add-on level (N2) and directly electrically connects two conducting elements (z1, z2) located on each side of said coating layer (220), characterised in that it also comprises electrolytic connection pads of the first type (10.2) on an add-on level (N3) directly superjacent to the given add-on level (N2), and each is electrically connected to an electrolytic connection pad of the second type (20.1) on the given add-on level (N2), an electrolytic connection pad of the first type (10.2) on the add-on level (N3) directly superjacent to the given add-on level (N2) is located directly in line with an electrolytic connection pad of the second type (20.2) on the given add-on level (N2) and is directly connected to this electrolytic connection pad of the second type (20.2).

14. Stacked electronic device according to claim 13, in which an electrolytic connection pad of the first type is a solder ball (10.20) or a micro-insert or a series of pin-shaped micro-inserts.

15. Stacked electronic device according to claim 13, in which several electronic components (130) are located side by side on a single level.

16. Electronic device of the first type according to claim 13, in which the thickness of an electrolytic connection pad of the first type (10.1) is less than that of an electrolytic connection pad of the second type (20.1).

17. Stacked electronic device according to claim 13, in which an electronic component (110) on an add-on level (N2) is assembled to the subjacent neighbouring level (N1) by gluing.

18. Stacked electronic device according to claim 13, in which a dielectric layer (22), coating the coating layer (220) and the electronic component (120) coated on the side by the coating layer (220) on the given add-on level (N2), has at least one opening at the top of an electrolytic connection pad of the second type (20.1) on the given add-on level (N2).

19. Stacked electronic device according to claim 18, in which at least one conducting track (z2) extends on the dielectric layer (22) and the opening, this conducting track (z2) possibly forming the conducting element placed on a face facing the add-on level (N3) directly superjacent to the given add-on level (N2) corresponding to one of the two conducting elements located on each side of said coating layer (220).

20. Stacked electronic device according to claim 13, in which an electrolytic connection pad of the first type (10.3) on the add-on level (N3) directly superjacent to the given add-on level (N2) is offset from an electrolytic connection pad of the second type (20.2) on the given add-on level (N2).

21. Stacked electronic device according to claim 13, in which a conducting element (z2) placed on a face facing the given add-on level (N2) electrically connected to an electrolytic connection pad of the first type (10.2) on the add-on level (N3) directly superjacent to the given add-on level (N2) is a conducting track that is also connected to the electrolytic connection pad of the second type (20.2) on the add-on level (N3) directly superjacent to the given add-on level (N2).

22. Stacked electronic device according to claim 13, in which two electrolytic connection pads of the same type on different levels are in line with each other.

23. Method for manufacturing a stacked electronic device comprising stacked electronic components (120, 130) distributed on at least one add-on level (N2, N3) on a base level (N1) possibly containing at least one electronic component (110), in which)
- a°) at least one electrolytic connection pad of the first type (10.1) formed from several pin-shaped micro-inserts is made on the base level (N1) by electrolysis, the electrolytic connection pad of the first type (10.1) being in direct electrical contact with a conducting element on the base level (N1);)
- b°) at least one electronic component (120) on the add-on level (N2) called the first add-on level is transferred onto the base level (N1) and is assembled such that a conducting element (c1, c2) carried by one face of the electronic component is in direct electrical contact with the electrolytic connection pad of the first type (10.1) made in step a°);
- c°) at least one electrolytic connection pad of the second type (20.1) is made by electrolysis on the base level (N1), the electrolytic connection pad of the second type (20.1) being in direct electrical contact with at least one second conducting element (1) on the base level (N1), this electrolytic connection pad of the second type (20.1) being flush with or projecting beyond the electronic component (120) on the first add-on level (N2);)
- d°) the electrolytic connection pad of the second type produced in step c°) and the electronic component (120) on the first add-on level (N2) are coated with a coating material (220), the top of the electrolytic connection pad of the second type (20.1) being exposed, steps a°) to d°) only contributing to make the first add-on level (N2);
- e°) electrolytic connection pads of the first type (10.2) formed from several pin-shaped micro-inserts are made on the first add-on level (N2) by electrolysis, each electrolytic connection pad of the first type (10.2) being in electrical contact with an electrolytic connection pad of the second type (20.1) made in step c°).

24. Method of manufacturing a stacked electronic device according to claim 23, in which a connection pad of the first type (10.2) made on the first add-on level (N2) is in direct electrical contact with a first conducting element (z2) on the first add-on level (N2).

25. Method of manufacturing a stacked electronic device according to claim 23, in which also:
- f°) at least one electronic component (130) is transferred from the second add-on level (N3) onto the first add-on level (N2) and assembly is done such that a conducting element (c1, c2) supported on one face of the electronic component (130) is in direct electrical contact with the electrolytic connection pad of the first type (10.2) made in step e°);
- g°) at least one electrolytic connection pad (20.2) of the second type is made on the first add-on level (N2) by electrolysis, the electrolytic connection pad of the second type (20.2) being in direct electrical contact with a second conducting element (z2) on the first add-on level (N2), this electrolytic connection pad of the second type (20.2) being flush with or projecting beyond the electronic component (120) on the second add-on level (N2);)
- h°) the electrolytic connection pad of the second type (20.2) made in step g°) and the electronic component (130) on the second add-on level (N3) are coated with a coating material (230), the top of the electrolytic connection pad of the second type (20.2) being exposed, these steps contributing to making the second add-on level (N3).

26. Method of manufacturing a stacked electronic device according to claim 25 in which steps e°) to h°) are repeated at least n times (where n is greater than or equal to two) so as obtain n+1 add-on levels, the first add-on level becoming the (n 1)th add-on level, the second add-on level becoming the nth add-on level, the base level becoming the (n−2)th level.

27. Method of manufacturing a stacked electronic device according to claim 23, in which the electrolytic connection pad of the second type (20.1) is located outside the footprint occupied on the subjacent level (N1, N2) by the electronic component (120) on the add-on level (N2, N3).

28. Method of manufacturing a stacked electronic device according to claim 23, in which in step d°), the top of the electrolytic connection pad of the second type (20.1) is exposed by grinding at least the coating material (220) and possibly the electronic component (120) on the first add-on level (N2).

29. Method of manufacturing a stacked electronic device according to claim 25, in which in step h°), the top of the electrolytic connection pad of the second type (20.1) and the electrolytic connection pad of the second type (20.2) is exposed by grinding at least the coating material (230) and possibly the electronic component (130) on the second add-on level (N3).

30. Method of manufacturing a stacked electronic device according to claim 23, in which the first conducting element (z1) and/or the second conducting element (z1) on the base level (N1) is made by etching a conducting base (1) formed on the surface of the base level (N1).

31. Method of manufacturing a stacked electronic device according to claim 25, in which the first conducting element (z2) and/or the second conducting element (z2) on the first add-on level (N2) is made by etching a conducting base (21) formed on the surface of the first add-on level (N2), this conducting base (21) being located above a dielectric layer (22) open at the top of the electrolytic connection pad of the second type (20.1) made in step g°).

32. Method of manufacturing a stacked electronic device according to claim 31, in which the first conducting element (z1) and the second conducting element (z1) in the base level (N1) are coincident and/or the first conducting element (z2) and the second conducting element (z2) on the first add-on level (N2) are coincident.

33. Method of manufacturing a stacked electronic device according to claim 23, in which it is possible to grow the electrolytic connection pad of the first type (10.2) made in step e°) directly on top of the electrolytic connection pad of the second type (20.1) made in step c°), by electrolysis.

34. Method of manufacturing a stacked electronic device according to claim 23, in which step b°) is performed after step c°).

35. Method of manufacturing a stacked electronic device according to claim 25, in which step f°) is performed after step g°).

36. Method of manufacturing a stacked electronic device according to claim 23, in which when step b°) is performed before step c°) the electronic component (120) is thinned before step c°).

37. Method of manufacturing a stacked electronic device according to claim 25, in which when step f°) is performed before step g°) the electronic component (120) is thinned before step g°).

38. Method of manufacturing a stacked electronic device according to claim 23, in which when the stacked electronic device comprises at least two elementary stacked electronic devices, a total or partial cut-out of the stacked electronic device is made after the last add-on level has been made, to separate the stacked elementary electronic devices from each other.

39. Method of manufacturing a stacked electronic device according to claim 38, in which the cut-out is a cut-out of at least one conducting element designed to electrically separate the elementary stacked electronic devices.

40. Method for manufacturing a stacked electronic device comprising stacked electronic components (120, 130) distributed on at least one add-on level (N2, N3) on a base level (N1) possibly containing at least one electronic component (110), in which)
- a1°) at least one electrolytic connection pad of the first type (10.1) is made on the base level (N1) by electrolysis, the electrolytic connection pad of the first type (10.1) being in direct electrical contact with a conducting element on the base level (N1);
- b1°) at least one electronic component (120) on the add-on level (N2) called the first add-on level is transferred onto the base level (N1) and is assembled such that a conducting element (c1, c2) carried by one face of the electronic component is in direct electrical contact with the electrolytic connection pad of the first type (10.1) made in step a1°);
- c1°) at least one electrolytic connection pad of the second type (20.1) is made by electrolysis on the base level (N1), the electrolytic connection pad of the second type (20.1) being in direct electrical contact with at least one second conducting element (1) on the base level (N1), this electrolytic connection pad of the second type (20.1) being flush with or projecting beyond the electronic component (120) on the first add-on level (N2);)
- d1°) the electrolytic connection pad of the second type produced in step c1°) and the electronic component (120) on the first add-on level (N2) are coated with a coating material (220), the top of the electrolytic connection pad of the second type (20.1) being exposed, steps a1°) to d1°) only contributing to make the first add-on level (N2);
- e1°) electrolytic connection pads of the first type (10.2) are made on the first add-on level (N2) by electrolysis, each electrolytic connection pad of the first type (10.2) being in electrical contact with an electrolytic connection pad of the second type (20.1) made in step c1°) and being located directly in line with an electrolytic connection pad of the second type (20.2) on the given add-on level (N2).

41. Method for manufacturing a stacked electronic device according to claim 40, in which a connection pad of the first type (10.2) made on the first add-on level (N2) is in direct electrical contact with a first conducting element (z2) on the first add-on level (N2).

42. Method of manufacturing a stacked electronic device according to claim 40, in which also:)
- f1°) at least one electronic component (130) on the second add-on level (N3) is transferred onto the first add-on level (N2) and is assembled such that a conducting element (c1, c2) carried by one face of the electronic component (130) is in direct electrical contact with the electrolytic connection pad of the first type (10.2) made in step e1°);
- g1°) at least one electrolytic connection pad (20.2) of the second type is made on the first add-on level (N2) by electrolysis, the electrolytic connection pad of the second type (20.2) being in direct electrical contact with a second conducting element (z2) on the first add-on level (N2), this electrolytic connection pad of the second type (20.2) being flush with or projecting beyond the electronic component (120) on the first add-on level (N2);
- h1°) the electrolytic connection pad of the second type (20.2) made in step g1°) and the electronic component (130) on the second add-on level (N3) are coated with a coating material (230), the top of the electrolytic connection pad of the second type (20.2) being exposed, these steps contributing to making the second add-on level (N3).

43. Method of manufacturing a stacked electronic device according to claim 42 in which steps e1°) to h1°) are repeated at least n times (where n is greater than or equal to two) so as obtain n+1 add-on levels, the first add-on level becoming the (n 1)th add-on level, the second add-on level becoming the nth add-on level, the base level becoming the (n−2)th level.

44. Method of manufacturing a stacked electronic device according to claim 40, in which the electrolytic connection pad of the second type (20.1) is located outside the footprint occupied on the subjacent level (N1, N2) by the electronic component (120) on the add-on level (N2, N3).

45. Method of manufacturing a stacked electronic device according to claim 40, in which in step d1°), the top of the electrolytic connection pad of the second type (20.1) is exposed by grinding at least the coating material (220) and possibly the electronic component (120) on the first add-on level (N2).

46. Method of manufacturing a stacked electronic device according to claim 42, in which in step h1°), the top of the electrolytic connection pad of the second type (20.2) is exposed by grinding at least the coating material (230) and possibly the electronic component (130) on the second add-on level (N3).

47. Method of manufacturing a stacked electronic device according to claim 40, in which the first conducting element (z1) and/or the second conducting element (z1) on the base level (N1) is made by etching a conducting base (1) formed on the surface of the base level (N1).

48. Method of manufacturing a stacked electronic device according to claim 40, in which the first conducting element (z2) and/or the second conducting element (z2) on the first add-on level (N2) is made by etching a conducting base (21) formed on the surface of the first add-on level (N2), this conducting base (21) being located above a dielectric layer (22) open at the top of the electrolytic connection pad of the second type (20.1) made in step g1°).

49. Method of manufacturing a stacked electronic device according to claim 48, in which the first conducting element (z1) and the second conducting element (z1) on the base level (N1) are coincident and/or the first conducting element (z2) and the second conducting element (z2) on the first add-on level (N2) are coincident.

50. Method of manufacturing a stacked electronic device according to claim 40, in which it is possible to grow the electrolytic connection pad of the first type (10.2) made in step e1°) directly on top of the electrolytic connection pad of the second type (20.1) made in step c1°), by electrolysis.

51. Method of manufacturing a stacked electronic device according to claim 40, in which step b1°) is performed after step c1°).

52. Method of manufacturing a stacked electronic device according to claim 42, in which step f1°) is performed after step g1°).

53. Method of manufacturing a stacked electronic component according to claim 40, in which when step b1°) is performed before step c1°), the electronic component (120) is thinned before step c1°).

54. Method of manufacturing a stacked electronic component according to claim 42, in which when step f1°) is performed before step g1°), the electronic component (120) is thinned before step g1°).

55. Method of manufacturing a stacked electronic device according to claim 40, in which when the stacked electronic device comprises at least two elementary stacked electronic devices, a total or partial cut-out of the stacked electronic device is made after the last add-on level has been made, to separate the stacked elementary electronic devices from each other.

56. Method of manufacturing a stacked electronic device according to claim 55, in which the cut-out is a cut-out of at least one conducting element designed to electrically separate the elementary stacked electronic devices.

57. Method for manufacturing a stacked electronic device comprising stacked electronic components (120, 130) distributed on at least one add-on level (N2, N3) on a base level (N1) possibly containing at least one electronic component (110), several electronic components (130) are located side by side on a single level contributing to forming several stacked elementary electronic devices, in which at least:)
  a2'°) a conducting base (1) is formed on the surface of the base level (N1),
  a2°) at least one electrolytic connection pad of the first type (10.1) is made on the conducting base (1) by electrolysis, the electrolytic connection pad of the first type (10.1) being in direct electrical contact with a conducting element on the base level (N1);)
  b2°) at least one electronic component (120) on the add-on level (N2) called the first add-on level is transferred onto the base level (N1) and is assembled such that a conducting element (c1, c2) carried by one face of the electronic component is in direct electrical contact with the electrolytic connection pad of the first type (10.1) made in step a2°);
  c2°) at least one electrolytic connection pad of the second type (20.1) is made by electrolysis on the conducting base on the base level (N1), the electrolytic connection pad of the second type (20.1) being in direct electrical contact with at least one second conducting element (1) on the base level (N1), this electrolytic connection pad of the second type (20.1) being flush with or projecting beyond the electronic component (120) on the first add-on level (N2);
  d2°) the electrolytic connection pad of the second type (20.1) produced in step c2°) and the electronic component (120) on the first add-on level (N2) are coated with a coating material (220), the top of the electrolytic connection pad of the second type (20.1) being exposed, steps a2°) to d2°) only contributing to make the first add-on level (N2);
  e2°) electrolytic connection pads of the first type (10.2) are made on the first add-on level (N2) by electrolysis, each electrolytic connection pad of the first type (10.2) being in electrical contact with an electrolytic connection pad of the second type (20.1) made in step c2°);
  e2'°) a total or partial cut-out of the stacked electronic device is made to separate the stacked elementary electronic devices from each other.

58. Method of manufacturing a stacked electronic device according to claim 57, in which between step e2°) and step e2'°):

f2°) at least one electronic component (130) is transferred from the second add-on level (N3) onto the first add-on level (N2) and assembly is done such that a conducting element (c1, c2) supported on one face of the electronic component (130) is in direct electrical contact with the electrolytic connection pad of the first type (10.2) made in step e2°);
  g2°) at least one electrolytic connection pad of the second type (20.2) is made on the first add-on level (N2) by electrolysis, the electrolytic connection pad of the second type (20.2) being in direct electrical contact with a second conducting element (z2) on the first add-on level (N2), this electrolytic connection pad of the second type (20.2) being flush with or projecting beyond the electronic component (120) on the second add-on level (N2);
  h2°) the electrolytic connection pad of the second type (20.2) made in step g2°) and the electronic component (130) on the second add-on level (N3) are coated with a coating material (230), the top of the electrolytic connection pad of the second type (20.2) being exposed, these steps contributing to making the second add-on level (N3).

59. Method of manufacturing a stacked electronic device according to claim 58, in which before step e2'°) steps e2°) to h2°) are repeated at least n times (where n is greater than or equal to two) so as obtain n+1 add-on levels, the first add-on level becoming the (n 1)th add-on level, the second add-on level becoming the nth add-on level, the base level becoming the (n−2)th level.

60. Method of manufacturing a stacked electronic device according to claim 57, in which a connection pad of the first type (10.2) made on the first add-on level (N2) is in direct electrical contact with a first conducting element (z2) on the first add-on level (N2).

61. Method of manufacturing a stacked electronic device according to claim 57, in which the electrolytic connection pad of the second type (20.1) is located outside the footprint occupied on the subjacent level (N1, N2) by the electronic component (120) on the add-on level (N2, N3).

62. Method of manufacturing a stacked electronic device according to claim 57, in which in step d2°), the top of the electrolytic connection pad of the second type (20.1) is exposed by grinding at least the coating material (220, 230) and possibly the electronic component (120, 130) on the first add-on level (N2).

63. Method of manufacturing a stacked electronic device according to claim 58, in which in step h2°), the top of the electrolytic connection pad of the second type (20.2) is exposed by grinding at least the coating material (230) and possibly the electronic component (130) on the second add-on level (N3).

64. Method of manufacturing a stacked electronic device according to claim 57, in which the first conducting element (z1) and/or the second conducting element (z1) on the base level (N1) is made by etching a conducting base (1) formed on the surface of the base level (N1).

65. Method of manufacturing a stacked electronic device according to claim 58, in which the first conducting element (z2) and/or the second conducting element (z2) on the first add-on level (N2) is made by etching a conducting base (21) formed on the surface of the first add-on level (N2), this conducting base (21) being located above a dielectric layer (22) open at the top of the electrolytic connection pad of the second type (20.1) made in step g2°).

66. Method of manufacturing a stacked electronic device according to claim 57, in which the first conducting element (z1) and the second conducting element (z1) on the base level (N1) are coincident and/or the first conducting element (z2) and the second conducting element (z2) on the first add-on level (N2) are coincident.

67. Method of manufacturing a stacked electronic device according to claim 57, in which it is possible to grow the electrolytic connection pad of the first type (10.2) made in step e2°) directly on top of the electrolytic connection pad of the second type (20.1) made in step c2°), by electrolysis.

68. Method of manufacturing a stacked electronic device according to claim 57, in which step b2°) is performed after step c2°).

69. Method of manufacturing a stacked electronic device according to claim 58, in which step f2°) is performed after step g2°).

70. Method of manufacturing a stacked electronic device according to claim 57, in which when step b2°) is performed before step c2°), the electronic component (120) is thinned before step c2°).

71. Method of manufacturing a stacked electronic device according to claim 58, in which when step f2°) is performed before step g2°), the electronic component (120) is thinned before step g2°).

72. Method of manufacturing a stacked electronic device according to claim 57, in which the cut-out is a cut-out of at least one conducting element designed to electrically separate the elementary stacked electronic devices.

\* \* \* \* \*